United States Patent [19]
Manela et al.

[11] Patent Number: 5,717,695
[45] Date of Patent: Feb. 10, 1998

[54] OUTPUT PIN FOR SELECTIVELY OUTPUTTING ONE OF A PLURALITY OF SIGNALS INTERNAL TO A SEMICONDUCTOR CHIP ACCORDING TO A PROGRAMMABLE REGISTER FOR DIAGNOSTICS

[75] Inventors: Philip R. Manela, San Mateo; Peter R. Birch, San Francisco; John C. Lin, Cupertino; Daniel R. Ullum, San Jose, all of Calif.

[73] Assignee: Silicon Graphics, Inc., Mountain View, Calif.

[21] Appl. No.: 566,900

[22] Filed: Dec. 4, 1995

[51] Int. Cl.⁶ .................. G11C 29/00; G01R 31/28; H03K 19/003
[52] U.S. Cl. .................. 371/21.1; 326/39; 371/22.2
[58] Field of Search .................. 371/27, 22.3, 21.1, 371/22.1, 22.2, 22.6; 326/39, 21, 46; 395/183.13, 183.18, 184.01

[56] References Cited

U.S. PATENT DOCUMENTS

| | | | |
|---|---|---|---|
| 4,670,879 | 6/1987 | Okino | 371/27 |
| 5,381,421 | 1/1995 | Dickol et al. | 371/27 |
| 5,412,260 | 5/1995 | Tsui et al. | 326/39 |
| 5,517,659 | 5/1996 | Bourekas et al. | 395/800 |

*Primary Examiner*—Hoa T. Nguyen
*Attorney, Agent, or Firm*—Wagner, Murabito & Hao

[57] ABSTRACT

A method of gaining access to multiple signals internal to a semiconductor chip while minimizing the number of pins dedicated for diagnostic and testing purposes. A chip designer determines which internal signals would most likely be helpful in troubleshooting and debugging a new chip design. These signals are input to a selector. A configuration register is loaded with information specifying which ones of these signals is to be routed to the output pin(s) so that they can be monitored externally by a logic analyzer in real-time. The selector only routes the currently designated signals to the appropriate output pin(s). Subsequently, a different set of signals can be selectively routed to the output pin(s) in place of the originally chosen signals.

21 Claims, 4 Drawing Sheets

5,717,695

OUTPUT PIN FOR SELECTIVELY OUTPUTTING ONE OF A PLURALITY OF SIGNALS INTERNAL TO A SEMICONDUCTOR CHIP ACCORDING TO A PROGRAMMABLE REGISTER FOR DIAGNOSTICS

FIELD OF THE INVENTION

The present invention pertains to the field of diagnostics and debugging of semiconductor chips.

BACKGROUND OF THE INVENTION

Electronic devices in the fields of computer systems, telecommunications, instrumentations, etc., are becoming ever more versatile, powerful, and faster. This is all made possible through advances in semiconductor technology. In today's competitive markets, semiconductor "chips" are becoming bigger and more complex in order to meet the demands for state-of-the-art performance. A single semiconductor chip can contain upwards of millions of transistors. As complexity, functionalities, speed, and the sizes of semiconductor chips increase, it is becoming a much more critical and difficult task to properly test, debug, and fix any problems associated with new designs and layouts.

Traditional debug procedures call for the monitoring of certain signals. By examining these electrical signals, it is possible to determine whether portions of the chip are working correctly. Any failures and errors can be isolated by analyzing these electrical signals. However, in reducing costs, semiconductor circuits are compacted as much as possible in order to minimize their die size (a smaller die directly translates into lower manufacturing costs because more chips can be fabricated from a given wafer). As the densities of integrated circuits increase, it becomes ever more difficult to gain access to these critical signals because they typically reside within the core of the chip.

Consequently, they must first be brought out through external pins before they can be monitored by a logic analyzer. Due to physical chip package constraints, only a limited amount of pins can be implemented for a given chip. Dedicated diagnostic output pins can be allocated to provide access to key internal signals. However, only a small number of dedicated diagnostic output pins are available. Whereas the number of potentially interesting signals can exceed hundreds or even thousands for a complex chip design. Adding more diagnostic pins becomes impractical as this would increase the size of the package, thereby also increasing the cost. And in some cases, package limitations prevent the addition of more pins.

One prior art approach for testing semiconductor chips has been to use "scan chains". Basically, scan chains are additional circuitry incorporated into the chip layout, which shift out the bits of information contained in the registers of interest. One can access the state of the processor to determine whether the chip is working properly by simply examining the bits of information that were shifted out via the scan chain. Thereby, scan chains provide controllability and observability of internal state for chip test purposes. However, a disadvantage of this approach is that the system must be stopped after each state transition in order to scan out the internal state. Repeatedly stopping and restarting the system will change the behavior of systems that are not fully synchronous. A further disadvantage is the added overhead of implementing the scan chain and its associated control logic, which consumes valuable resources and may not be acceptable for certain applications.

Therefore, there is a need for a straightforward method to transparently monitor the state of large numbers of internal signals through a small number of pins.

SUMMARY OF THE INVENTION

The present invention pertains to a method of gaining access to multiple signals internal to a semiconductor chip while minimizing the number of output pins dedicated for diagnostic and testing purposes. A chip designer determines which internal signals would most likely be helpful in troubleshooting and debugging a new chip design. These signals are input to a selector. A configuration register is then loaded with information specifying which ones of these signals is to be routed to the output pin(s) so that they can be monitored externally by a logic analyzer in real-time. The real-time monitoring function is valuable for debugging while the system is running normal operations. The selector only routes the currently designated signals to the appropriate output pin(s). Subsequently, a different set of signals can be selectively routed, under software control via the selector, to the output pin(s) in place of the originally chosen signals. Thereby, a large number of internal signals can be monitored externally by using a limited number of pins. In one embodiment, the signals from the output port(s) are used as inputs to external circuitry in order to change the behavior of the system.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

An apparatus and method for transparently monitoring the state of large numbers of internal signals of a semiconductor chip through a small number of pins is described. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

In the present invention, a complex integrated circuit is developed to contain one or more programmable watchpoint ports. These ports allow critical internal nets to be monitored in real-time during normal operation. Alternatively, these ports also allow the critical internal nets to be read back under software control. The real-time monitoring function is valuable for debugging system operations that were not simulated. The signals that were read out can subsequently be used as inputs to external circuitry, if necessary, to change the behavior of a system that does not function correctly under certain conditions.

Figure 1:
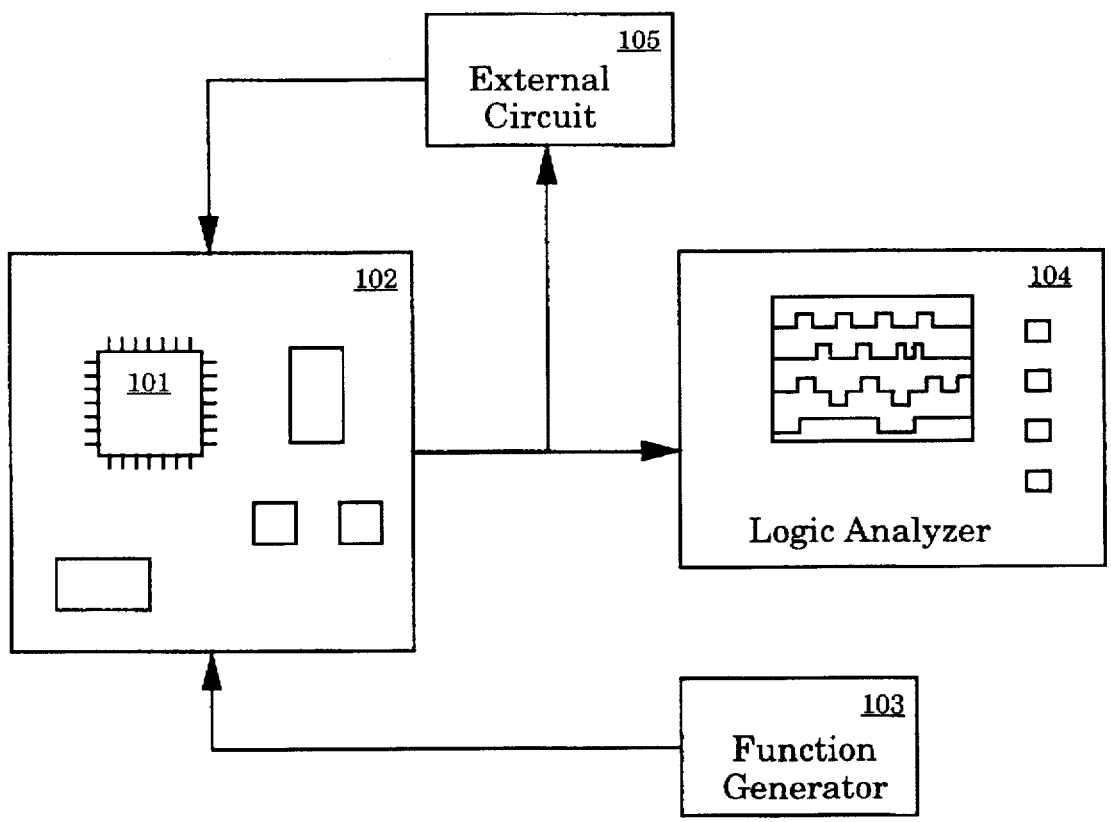
FIG. 1 shows a block diagram of the test system layout.

Referring to FIG. 1, a block diagram of the test system layout is shown. A semiconductor chip 101 is as part of an overall system 102. Certain pins of chip 101 are brought out of system 102 so that the electrical signals on those pins can be monitored by external test equipment, such as logic analyzer 104. The electrical signals of interest may include those signals that were selected for output by the diagnostic watchpoint port(s) as well as normal output signals. Alternatively, the monitoring can be accomplished by reading from a location in the chip's 101 address space. A function generator 103 is used to provide input signals, if necessary, to chip 101. In the currently preferred embodiment, chip 101 is tested as part of a running computer system. System 102 includes all of the components of the computer system so that chip 101 can be tested as part of normal system operations. Alternatively, chip 101 may be placed within a specially designed test fixture.

In order to debug chip 101, the signals monitored by logic analyzer 104 are captured as the computer system is running. Logic analyzer 104 continues capturing the signals of interest until a failure occurs. The signals that were captured at the point of failure are studied and analyzed to gain insight into the cause of the failure. Often, this procedure is repeated because one set of captured values leads to additional signals that should be monitored in order to shed further light on the problem. Eventually, the cause of the failure is fully understood, and an appropriate hardware or software fix is designed. In an alternative embodiment, the internal signals that are selected for output via the programmable diagnostic watchpoint port are input to external circuitry 105. External circuitry 105 can be used to provide design changes. The modified signals from external circuitry 105 can be fed back to system 102 in an effort to fix any failures.

Figure 2:
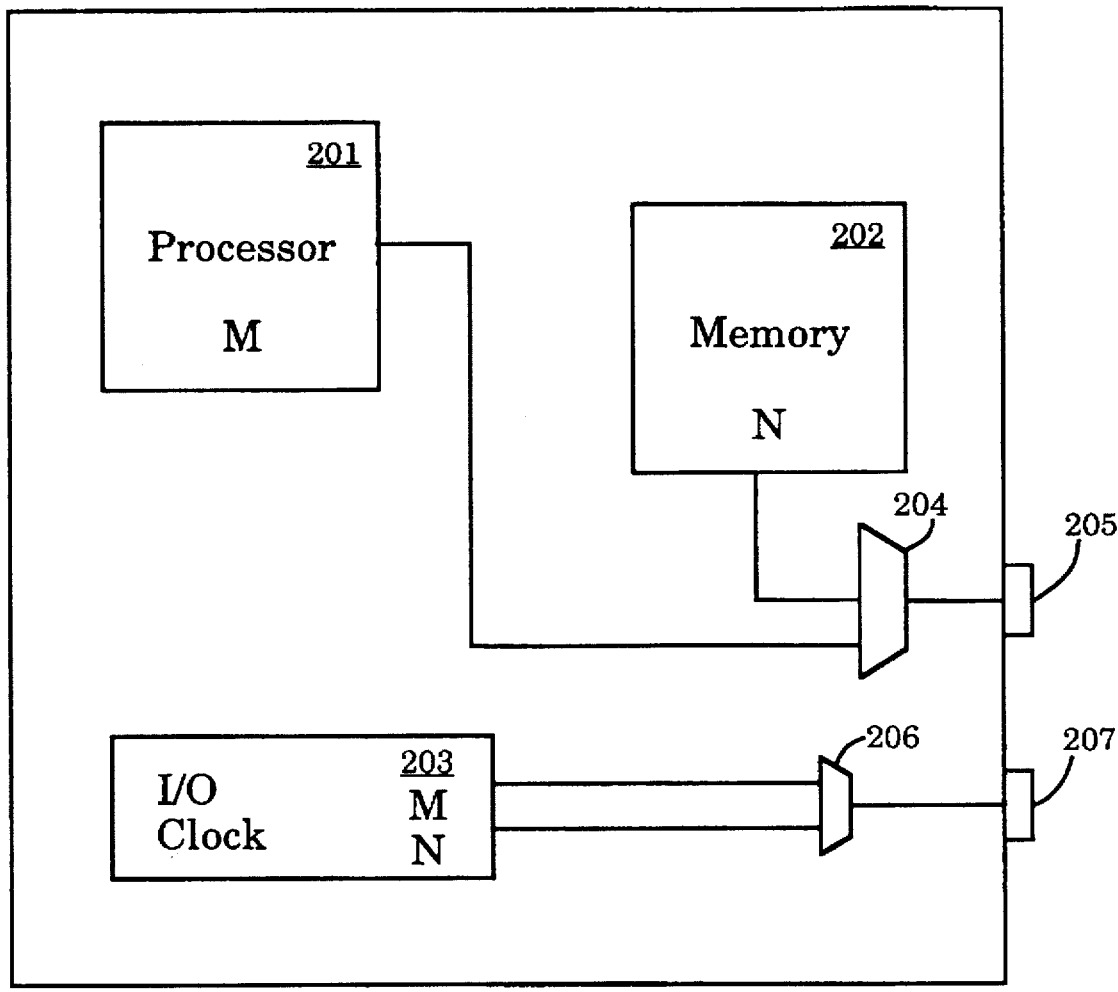
FIG. 2 shows a single diagnostic watchpoint port.

FIG. 2 shows two diagnostic watchpoint ports 205 and 207. Semiconductor chip 101 can contain several different types of logic, such as processor 201, memory 202, and input/output and clocks 203. It should be noted that the present invention can be applied to test any type of integrated circuits and semiconductor chips (e.g., microprocessors, digital signal processors, graphics chips, programmable logic devices, memory chips, controllers, etc.). One or more groups of signals that are of interest are determined by the designer to be connected to multiplexer/selector 204. For instance, "M" group of signals from processor 201 and "N" group of signals from memory 202 can be directly connected to multiplexer/selector 204.

The function of multiplexer/selector 204 is to single out one of these M or N signals to output to pin 205. For example, if the test engineer suspects that there is a timing problem, the test engineer can instruct multiplexer/selector 204 to select one of the clock signals to be output onto pin 205 so that particular clock signal can be monitored. If the clock signal appears to be functioning correctly, the test engineer might wish to examine one of the signals internal to processor 201. This can be accomplished by instructing multiplexer/selector 204 to switch from the clocking signal to the processor signal of interest for output to pin 205. It should be noted that multiplexer/selector 204 is not limited to having just a single output. Multiplexer/selector 204 can select from N number of inputs for output onto M number of output pins. In one embodiment, the clock corresponding to the signal currently being output through the diagnostic watch point port is selected for output monitoring. For example, if a signal from group "M" is output on pin 205, then multiplexer 206 selects clock line "M". Conversely, if a signal from group "N" is output on pin 205 via multiplexer 204, then clock "N" is output on pin 205.

Figure 3:
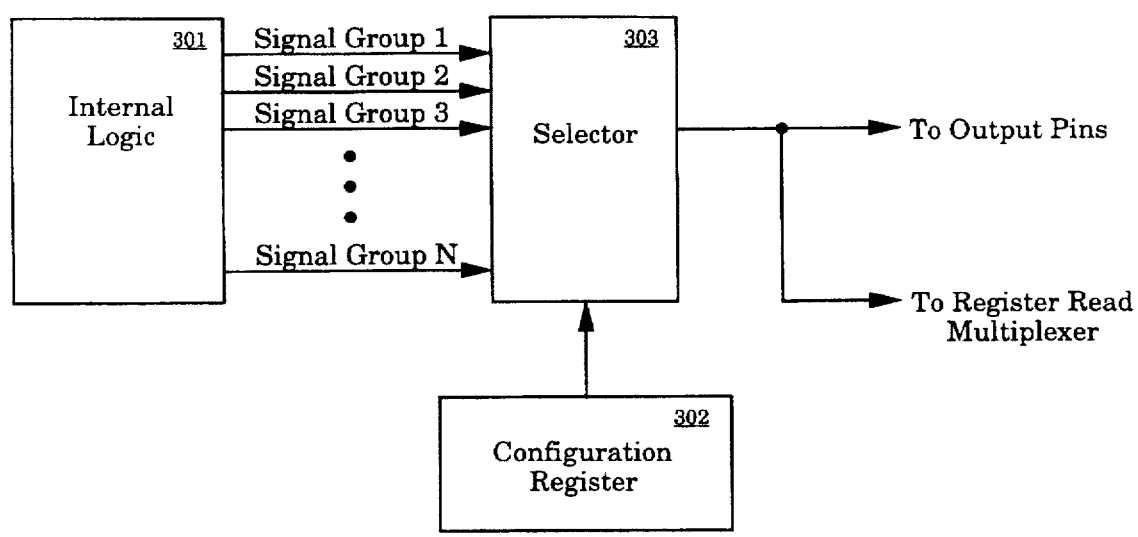
FIG. 3 shows a more detailed schematic of the currently preferred embodiment of the programmable diagnostic watchpoint port.

FIG. 3 shows a more detailed schematic of the currently preferred embodiment of the programmable diagnostic watchpoint port. Various signal groups are chosen from the internal logic 301 by the designer based on their likelihood of aiding in troubleshooting. In other words, the chip designer determines at design time, which internal signals would be useful in a debug environment. This determination is based on knowledge of the designer and experience gained while debugging the design during the simulation phase of the project. These signal groups are coupled to a selector 303. In other words, the data inputs (e.g., signal groups 1–N) to selector 303 are the internal signals that are to be monitored. Signals of interest are assigned to selector inputs in such a way as to allow collections of related signals to be viewed simultaneously.

Selector 303 is built out of purely combinational logic. Thereby, no assumptions need to be made about the clock domain of the signals being monitored. Signals of interest are buffered before being sent to the selector 303. This is done so that loading due to global route does not adversely affect timing. The width of selector 303 is determined by the number of available output pins. The fan-in of selector 303 is determined by the total number of internal signals that are to be monitored. The control for the selector 303 comes from a statically configured register 302. Configuration register 302 is unused in normal operation. Configuration register 302 is unused except for selecting the appropriate signal group. This ensures that the signal group selected is independent of the operation being performed. The output of selector 303 is driven onto output pins, where it can be continuously monitored by a logic analyzer. The output of selector 303 is also made available to software running on the Computer system as a read-only memory location.

Figure 4:
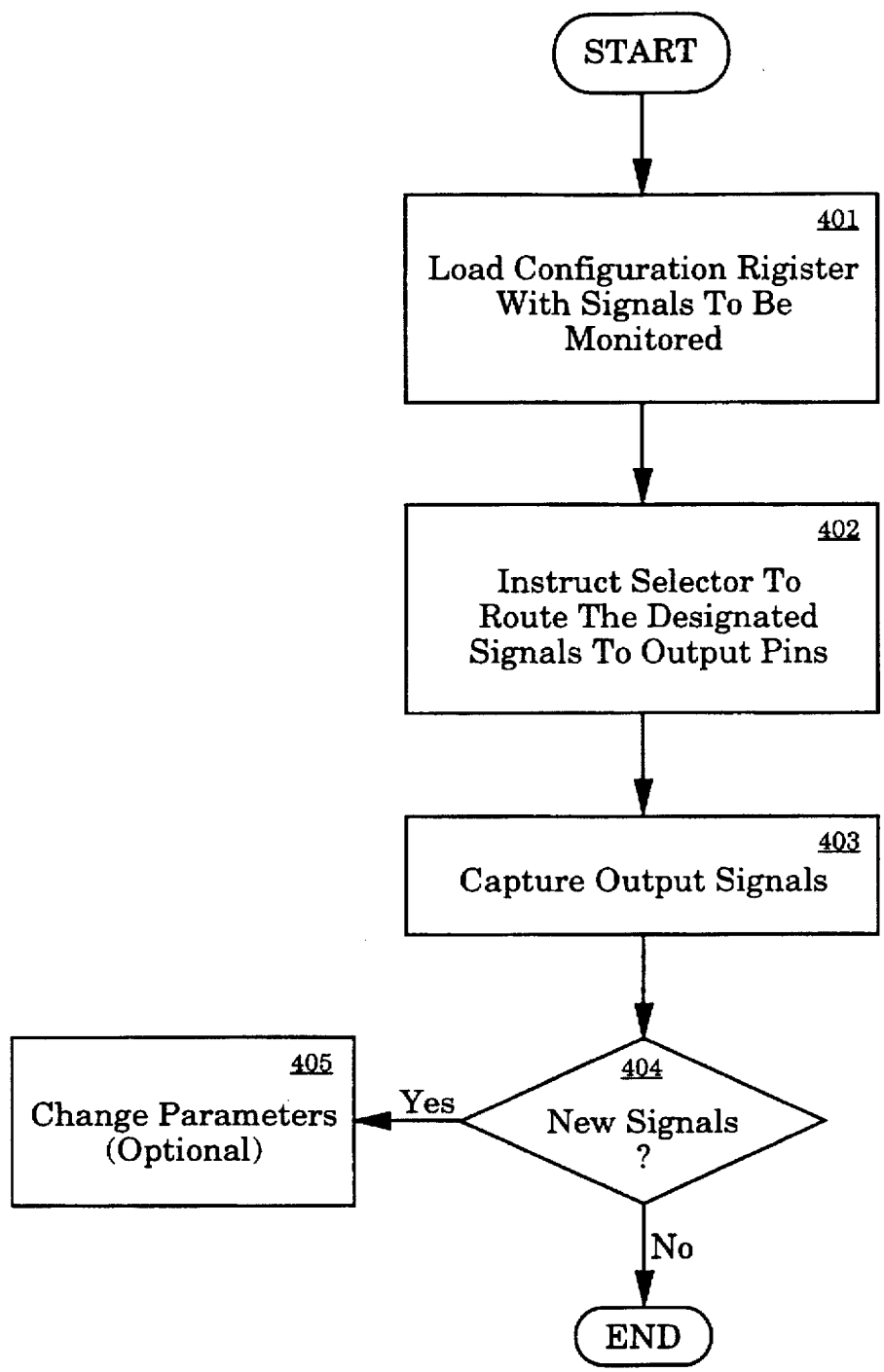
FIG. 4 is a flowchart describing the steps for testing and debugging a system.

FIG. 4 is a flowchart describing the steps for testing and debugging a system. Initially, the chip designer decides which signals are to be input to a selector. A configuration register or similar memory is loaded with a selection by the user of those signals which the user wishes to monitor in real-time, step 401. Based on this information, the selector is instructed to route the designated signals to the output pins, step 402. The signals that were selected for output are then captured for analysis, step 403. In step 404, a determination is made as to whether the user wishes to monitor any different signals. If the user wishes to monitor a different set of signals, steps 401–403 are repeated for the new set of signals. Step 405 is an optional step, wherein the test engineer may choose to alter certain system parameters based on the analysis of the signals that were obtained in step 403.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of testing a semiconductor chip, comprising the steps of:

operating the semiconductor chip as part of normal system operations;

programming a configuration register to select a first electrical signal which is internal to the semiconductor chip for output to an output pin of the semiconductor chip;

selecting the first electrical signal that is internal to the semiconductor chip by a multiplexer, wherein the multiplexer is controlled by the configuration register;

routing the first electrical signal to the output pin of the semiconductor chip through the multiplexer;

monitoring the first electrical signal that is output on the output pin;

programming the configuration register to select a second electrical signal which is internal to the semiconductor chip for output to the output pin of the semiconductor chip;

selecting the second electrical signal that is internal to the semiconductor chip by the multiplexer, wherein the multiplexer is controlled by the configuration register;

routing the second electrical signal to the output pin, wherein the second electrical signal rather than the first electrical signal is output on the output pin;

monitoring the second electrical signal that is output on the output pin.

2. The method of claim 1 further comprising the steps of:

running the semiconductor chip until a failure occurs;

repeating the selecting, routing and monitoring steps for a plurality of electrical signals until the failure is identified.

3. The method of claim 1, wherein the first electrical signal and the second electrical signal are monitored in real-time.

4. The method of claim 1 further comprising the steps of:

inputting the first electrical signal to an external circuit;

implementing design changes based on an output from the external circuit.

5. The method of claim 1 further comprising the step of coupling a logic analyzer to the output pin, wherein the logic analyzer displays the first electrical signal and the second electrical signal.

6. The method of claim 1 further comprising the steps of:

storing characteristics of the first electrical signal and characteristics of the second electrical signal into a memory;

reading the memory to determine the characteristics corresponding to the first electrical signal and the second electrical signal.

7. The method of claim 1 further comprising the step of buffering the first electrical signal and the second electrical signal so that timing is not adversely affected.

8. The method of claim 1 further comprising the steps of selecting a first clock signal for output when the first electrical signal is selected according to the configuration register and selecting a second clock signal when the second electrical signal is selected according to the configuration register.

9. The apparatus of claim 8 further comprising a circuit external to the semiconductor chip coupled to the output pin for generating test signals based on either the first signal or the second signal.

10. The apparatus of claim 8 further comprising a memory coupled to the selector for storing characteristics corresponding to either the first electrical signal or the second electrical signal, wherein the characteristics are read back for performing diagnostics on the semiconductor chip.

11. An apparatus for testing a semiconductor chip, comprising:

logic internal to the semiconductor chip that generates a first electrical signal and a second electrical signal;

a programmable register coupled to the logic for storing selection information corresponding to selection of either the first electrical signal or the second electrical signal;

an output pin of the semiconductor chip for outputting either the first electrical signal or the second electrical signal for performing diagnostics on the semiconductor chip a selector coupled to the logic that accepts the first electrical signal and the second electrical signal as inputs and selects between the first signal and the second signal for output onto the output pin of the semiconductor chip according to the selection information stored in the programmable register.

12. The apparatus of claim 11, wherein the selector is comprised of an N×M multiplexer.

13. The apparatus of claim 12, wherein the multiplexer is controlled by software.

14. The apparatus of claim 11 further comprising a logic analyzer that is coupled to the output pin, wherein either the first electrical signal or the second electrical signal is displayed in real-time by the logic analyzer.

15. The apparatus of claim 11, wherein the selector selects amongst N number of internal signals for output on M number of output pins.

16. The apparatus of claim 11 further comprising a second selector for selecting between a first clock signal and a second clock signal for output, wherein the first clock signal is selected when the first electrical signal is selected and the second clock signal is selected when the second electrical signal is selected.

17. A method of accessing one of a plurality of signals internal to an integrated circuit through a single output pin, comprising the steps of:

inputting each of the plurality of signals to a selector;

programming a register with information specifying which particular signal of the plurality of signals is to be output onto the output pin;

routing only that particular signal to the output pin;

monitoring that particular signal;

programming the register with information specifying a second signal from the plurality of signals for monitoring;

switching the routing so that the second signal instead of the first signal is routed to the output pin;

monitoring the second signal.

18. The method of claim 17, wherein the monitoring step is performed in real-time.

19. The method of claim 17, wherein the particular signal is read back under software control.

20. The method of claim 17 further comprising the step of coupling an external circuit to the output pin to implement design changes.

21. The method of claim 17 further comprising the step of switching between a first clock signal and a second clock signal according to which one of the plurality of signals is routed to the output pin.

* * * * *